United States Patent
Feyh

(10) Patent No.: US 9,556,016 B2
(45) Date of Patent: Jan. 31, 2017

(54) CAPACITIVE MEMS SENSOR AND METHOD

(71) Applicant: Robert Bosch GmbH, Stuttgart (DE)

(72) Inventor: Ando Feyh, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 356 days.

(21) Appl. No.: 13/969,525

(22) Filed: Aug. 17, 2013

(65) Prior Publication Data
US 2015/0360933 A1      Dec. 17, 2015

Related U.S. Application Data

(60) Provisional application No. 61/691,157, filed on Aug. 20, 2012.

(51) Int. Cl.
| | |
|---|---|
| B81B 7/02 | (2006.01) |
| H01L 21/00 | (2006.01) |
| B81B 3/00 | (2006.01) |
| G01L 9/00 | (2006.01) |
| B81C 1/00 | (2006.01) |

(52) U.S. Cl.
CPC ......... *B81B 3/0027* (2013.01); *B81C 1/00166* (2013.01); *G01L 9/0045* (2013.01); *G01L 9/0073* (2013.01); *B81B 2201/0264* (2013.01); *B81B 2203/04* (2013.01); *B81C 1/0038* (2013.01)

(58) Field of Classification Search
None
See application file for complete search history.

(56) References Cited

U.S. PATENT DOCUMENTS

| | | | |
|---|---|---|---|
| 4,581,676 A * | 4/1986 | Baxter | H01G 5/16 |
| | | | 361/283.4 |
| 6,158,280 A | 12/2000 | Nonomura et al. | |
| 6,664,126 B1 | 12/2003 | Devoe et al. | |
| 6,913,941 B2 | 7/2005 | O'Brien et al. | |
| 7,056,757 B2 | 6/2006 | Ayazi et al. | |
| 7,825,484 B2 | 11/2010 | Martin et al. | |
| 2001/0038148 A1 | 11/2001 | Mastromatteo et al. | |
| 2005/0127499 A1* | 6/2005 | Harney | B81B 7/007 |
| | | | 257/704 |

(Continued)

FOREIGN PATENT DOCUMENTS

JP         H1048246 A       8/1998

OTHER PUBLICATIONS

Candler et al., "Long-Term and Accelerated Life Testing of a Novel Single-Wafer Vacuum Encapsulation for MEMS Resonators," Journal of Microelectromechanical Systems, Dec. 2006, pp. 1446-1456, vol. 15, No. 6, IEEE, USA (11 pages).

(Continued)

*Primary Examiner* — Michael Lebentritt
*Assistant Examiner* — Jordan Klein
(74) *Attorney, Agent, or Firm* — Maginot Moore & Beck LLP

(57) ABSTRACT

A system and method for forming a sensor device includes defining an in-plane electrode in a device layer of a silicon on insulator (SOI) wafer, forming an out-of-plane electrode in a silicon cap layer located above an upper surface of the device layer, depositing a silicide-forming metal on a top surface of the silicon cap layer, and annealing the deposited silicide-forming metal to form a silicide portion in the silicon cap layer.

18 Claims, 6 Drawing Sheets

(56) References Cited

U.S. PATENT DOCUMENTS

| | | | |
|---|---|---|---|
| 2006/0098059 A1* | 5/2006 | Ohguro | B81B 3/0018 347/72 |
| 2006/0246631 A1* | 11/2006 | Lutz | B81B 3/0005 438/127 |
| 2006/0267109 A1* | 11/2006 | Ohguro | B81C 1/00333 257/396 |
| 2007/0249082 A1* | 10/2007 | Hanaoka | B81C 1/00246 438/53 |
| 2008/0128841 A1* | 6/2008 | Fujimori | B81B 7/0058 257/418 |
| 2009/0115429 A1* | 5/2009 | Lee | G01D 5/2451 324/662 |
| 2010/0032775 A1 | 2/2010 | Morris, III et al. | |
| 2010/0193884 A1* | 8/2010 | Park | B81C 1/00269 257/414 |
| 2010/0295138 A1 | 11/2010 | Montanya Silvestre et al. | |
| 2012/0091589 A1* | 4/2012 | Cabral, Jr. | H01L 21/28518 257/754 |
| 2012/0261822 A1 | 10/2012 | Graham et al. | |
| 2013/0032904 A1* | 2/2013 | Feyh | B81B 3/0008 257/415 |
| 2013/0036827 A1* | 2/2013 | Besling | G01L 9/0045 73/753 |

OTHER PUBLICATIONS

Chen et al., "An Integrated Solution for Wafer-Level Packaging and Electrostatic Actuation of Out-Of-Plane Devices," Paper from Stanford University, 2009, pp. 1071-1074, IEEE, USA (4 pages).

Chen, "Electrode Integrated Wafer-Level Packaging for Out-of-Plane MEMS Devices," Abstract Preview, International Microelectronics and Packaging Society, 2009, USA (1 pages).

Hyldgård et al., "Fish & Chips: Single Chip Silicon MEMS CTDL Salinity, Temperature, Pressure and Light Sensor for Use in Fisheries Research," Sensors, 2005, IEEE, pp. 1124-1127 (4 pages).

Park et al., "Untraminiature encapsulated accelerometers as a fully implantable sensor for implantable hearing aids," Biomed Microdevices, 2007, Springer, USA (11 pages).

Web site publication, "Encapsulation for RF MEMS," http://micromachine.stanford.edu/~kuanlinc/Professional/Encapsulation%/20for20%RF%20 . . . Downloaded Apr. 1, 2011, (4 pages).

International Search Report and Written Opinion corresponding to PCT Application No. PCT/US2013/055553, mailed Dec. 13, 2013 (13 pages).

* cited by examiner

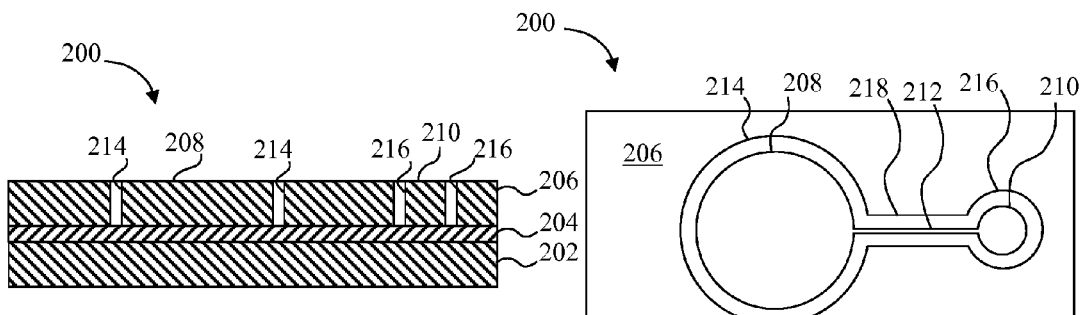
FIG. 3
FIG. 4
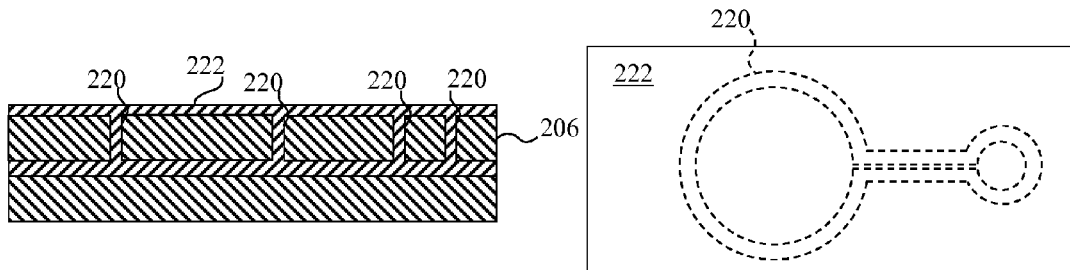
FIG. 5
FIG. 6
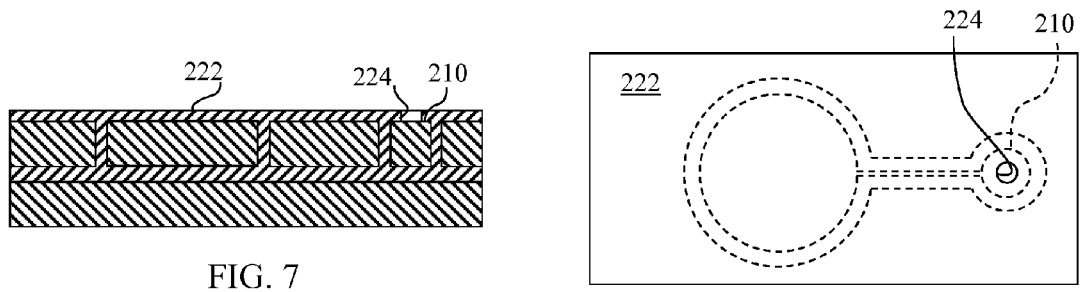
FIG. 7
FIG. 8

CAPACITIVE MEMS SENSOR AND METHOD

This application claims the benefit of U.S. Provisional Application No. 61/691,157, filed Aug. 20, 2012.

FIELD OF THE INVENTION

The present disclosure relates to capacitive micro electrical mechanical system (MEMS) sensors.

BACKGROUND

A capacitive MEMS pressure sensor requires two electrodes that move relative to each other under an applied pressure. This configuration is most often accomplished by having a fixed electrode (hereafter called the lower electrode) formed in a substrate while a moveable electrode (hereafter called the upper electrode) is provided in a deformable membrane which is exposed to the pressure that is to be sensed. One or more of the electrodes are typically formed by deposition of a conductive film, electrical isolation of a conductive layer, or by adding an oxide layer between two conductive materials.

FIG. 1 depicts a side cross-sectional view of a MEMS pressure sensor 10 such as described in U.S. patent application Ser. No. 13/232,005 which was filed on Sep. 14, 2011, the entire contents of which are herein incorporated by reference. The pressure sensor 10 includes a pair of electrodes that are configured to move relative to one another. The pressure sensor 10 includes a handle layer 12, a buried oxide layer 14, and a device layer 16. An oxide layer 18 separates the device layer 16 from a cap layer 20. A passive layer 22 is located above the cap layer 20.

Within the device layer 16, an in-plane electrode 24 is defined by two etch portions 26 and 28. The in-plane electrode 24 is isolated from the cap layer 20 by an etched portion 30 of the oxide layer 18. The etched portions 26, 28, and 30 are etched through vent holes 32 which are closed by the cap layer 20.

An out-of plane electrode 34 is located above the in-plane electrode 24 and electrically isolated from the in-plane electrode 24 by the etched portion 30. The out-of-plane electrode 34 is isolated from the rest of the cap layer 20 by two spacers 36 and 38. The spacers 36 and 38 include a lower nitride portion 40 which extends upwardly from the etched portion 30, and an upper oxide portion 42 which extends from the nitride portion 40 to the upper surface of the cap layer 20.

Spacers 44 and 46, which are formed like the spacers 36 and 38, electrically isolate a connector 48 in the cap layer 20 from the rest of the cap layer 20. The connector 48 is in electrical communication with a connector 50 in the device layer 16. The connector 50 is in electrical communication with the in-plane electrode 24 and isolated from the remainder of the device layer 16 by isolation posts 52 and 54. The isolation posts 52 and 54 extend from the buried oxide layer 14 to the oxide layer 18. A bond pad or trace 56 is located above the passive layer 22 and in electrical communication with the connector 48.

The traces of a sensor device, such as the trace 56 of the pressure sensor 10 of FIG. 1, are often formed from a layer of metal deposited on a top surface of the sensor device. The placement of metal on the top surface of the sensor device, however, can lead to aging and drifting of the sensor properties. These property changes are generally due to the lack of mechanical stability of metallic films. Moreover, the metal layer deposited on the top surface of the sensor is typically patterned to provide the individual electrical connections to the various sensor components, thus adding an extra processing step.

What is needed is a capacitive sensor which does not use an applied metal layer to provide electrical connection to electrodes within the device. A sensor that does not use an applied metal layer which can be manufactured with known fabrication processes would be further beneficial.

SUMMARY

In accordance with one embodiment, a method of forming a sensor device includes defining an in-plane electrode in a device layer of a silicon on insulator (SOI) wafer, forming an out-of-plane electrode in a silicon cap layer located above an upper surface of the device layer, depositing a silicide-forming metal on a top surface of the silicon cap layer, and annealing the deposited silicide-forming metal to form a silicide portion in the silicon cap layer.

In another embodiment, a sensor device, includes an in-plane electrode, a cap layer spaced apart from an upper surface of the in-plane electrode, an out-of-plane electrode defined in the cap layer, and a silicide portion formed in the cap layer.

BRIEF DESCRIPTION OF THE DRAWINGS

FIG. 3 depicts a side cross-sectional view of a wafer with a device layer etched to define an in-plane-electrode;

FIG. 4 depicts a top plan view of the wafer of FIG. 3;

FIG. 5 depicts the wafer of FIG. 3 with the trenches filled with an oxide material and an oxide layer formed above the device layer;

FIG. 6 depicts a top plan view of the wafer of FIG. 5;

FIG. 7 depicts the wafer of FIG. 5 with an opening etched in the oxide layer above a contact portion of the device layer;

FIG. 8 depicts a top plan view of the wafer of FIG. 7;

DESCRIPTION

Figure 1:
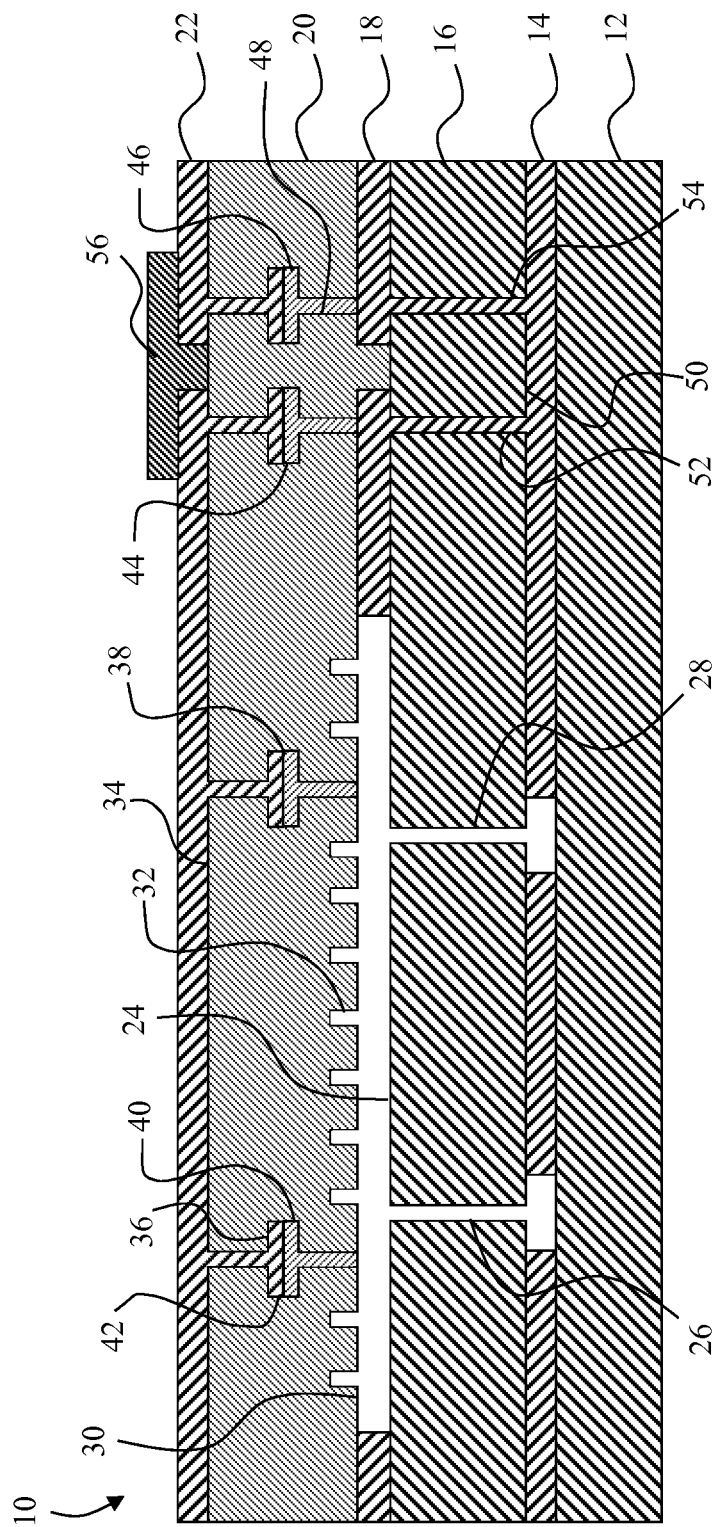
FIG. 1 depicts a side cross-sectional view of a known sensor device having a metal layer deposited and patterned on a top surface of the sensor.

For the purpose of promoting an understanding of the principles of the disclosure, reference will now be made to the embodiments illustrated in the drawings and described in the following written specification. It is understood that no limitation to the scope of the disclosure is thereby intended. It is further understood that the disclosure includes any alterations and modifications to the illustrated embodiments and includes further applications of the principles of the disclosure as would normally occur to one skilled in the art to which this disclosure pertains.

In many of these embodiments, a MEMS sensor may be used to sense a physical condition such as acceleration, pressure, or temperature, and to provide an electrical signal representative of the sensed physical condition. The embodiments may be implemented in or associated with a variety of applications such as automotive, home appliances, laptops, handheld or portable computers, mobile telephones, smart phones, wireless devices, tablets, personal data assistants (PDAs), MP3 players, camera, GPS receivers or navigation systems, electronic reading displays, projectors, cockpit controls, game consoles, earpieces, headsets, hearing aids, wearable display devices, security systems, and etc.

Figure 2:
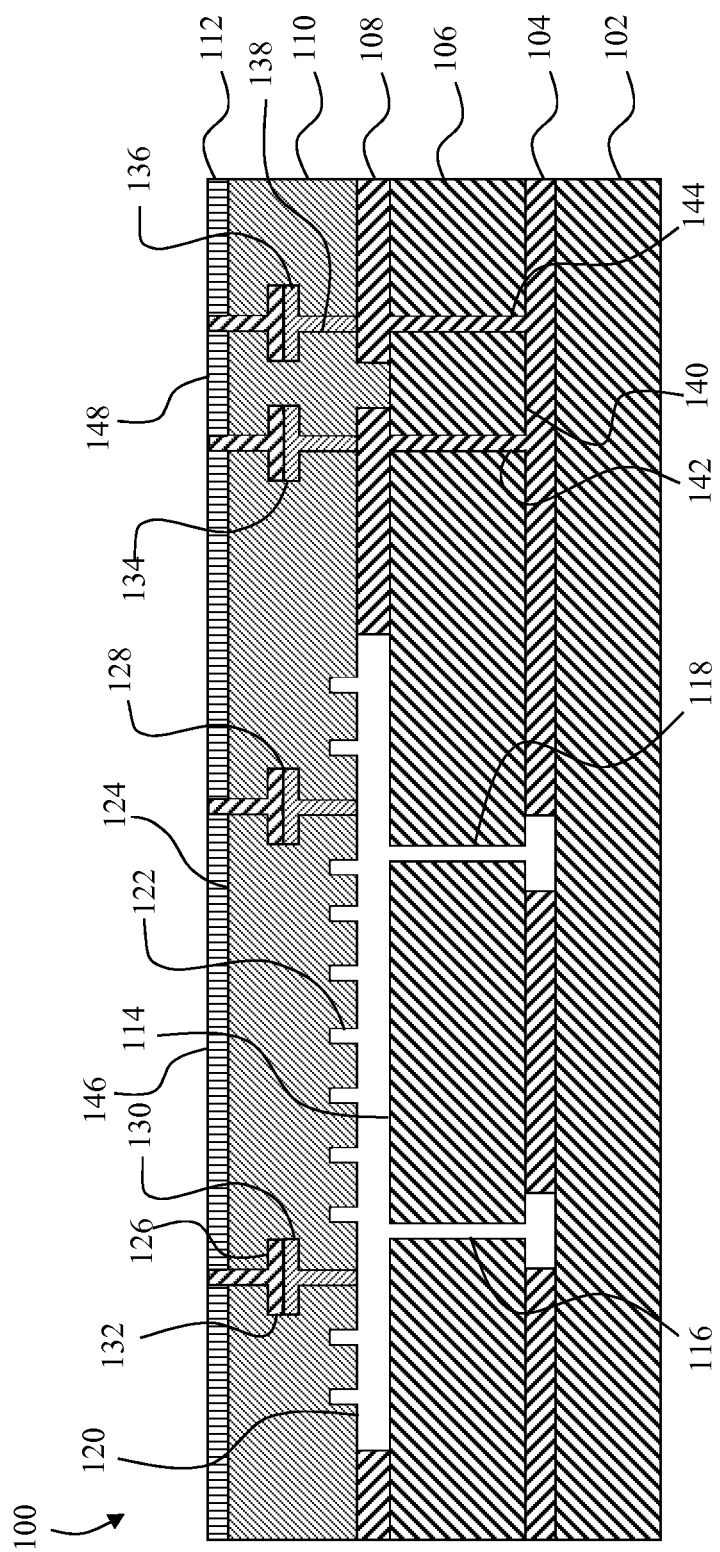
FIG. 2 depicts a sensor device which includes silicide in a top portion of a cap layer.

FIG. 2 depicts a pressure sensor 100. The pressure sensor 100 includes a handle layer 102, a buried oxide layer 104, and a device layer 106. An oxide layer 108 separates the device layer 106 from a cap layer 110. A silicide layer 112 is located above the cap layer 110.

Within the device layer 106, an in-plane electrode 114 is defined by two etch portions 116 and 118. The in-plane electrode 114 is isolated from the cap layer 110 by an etched portion 120 of the oxide layer 108. The etched portions 116, 118, and 120 are etched through vent holes 122 which are closed by the cap layer 110.

An out-of plane electrode 124 is located above the in-plane electrode 114 and electrically isolated from the in-plane electrode 114 by the etched portion 120. The out-of-plane electrode 124 is isolated from the rest of the cap layer 110 by two non-silicon spacers 126 and 128. The spacers 126 and 128 include a lower nitride portion 130 which extends upwardly from the etched portion 120, and an upper oxide portion 132 which extends from the nitride portion 130 to the upper surface of the cap layer 110. The detection signal is the capacity and or capacitance change between the electrodes 114 and 124. The electrode 124 is deflected as a function of the outside pressure.

Spacers 134 and 136, which are formed like the spacers 126 and 128, electrically isolate a connector 138 in the cap layer 110 from the rest of the cap layer 110. The connector 138 is in electrical communication with a connector 140 in the device layer 106. The connector 140 is in electrical communication with the in-plane electrode 114 and isolated from the remainder of the device layer 106 by isolation posts 142 and 144. The isolation posts 142 and 144 extend from the buried oxide layer 104 to the oxide layer 108.

The spacers 126 and 128 also define and electrically separate a silicide portion 146 from the rest of the silicide layer 112 while the spacers 134 and 136 electrically separate a silicide portion 148 from the rest of the silicide layer 112

Silicides are common materials in semiconductor processing. Silicide has a very low electric resistance that is comparable to the resistance of metals and has mechanical properties that are comparable to those of silicon. Moreover, silicides are highly conductive. Thus, silicide materials are well-suited for mechanically sensitive pressure sensor membranes.

The silicide portions 146 and 148 in the pressure sensor 100 of FIG. 2 enable electrical communication with the connectors 138, 140 and the in-plane electrode 114 from a top surface of the pressure sensor 100. As shown by comparing FIG. 1 and FIG. 2, the silicide layer 112 in the pressure sensor 100 replaces the passive layer 22 and the trace 56 of the prior art pressure sensor 10. Consequently, the process steps for forming the passive layer 22 and the trace 56 are eliminated. Alternatively, the passive layer 22 can be added on top of the silicide.

A process for forming a sensor such as the pressure sensor 100 is discussed with reference to FIGS. 3-25. Referring initially to FIGS. 3 and 4, an SOI wafer 200 including a handle layer 202, a buried oxide layer 204, and a device layer 206 is initially etched to define an in-plane electrode 208 and a lower contact portion 210 for the in-plane-electrode 208. A connector 212 is etched between the in-plane electrode 208 and the lower contact portion 210. The in-plane electrode 208 is defined by a trench portion 214, while the lower contact portion 210 is defined by a trench portion 216 and the connector 212 is defined by a trench portion 218. If desired, the structural or handle layer 202 may be a pressure chemical vapor deposition (LPCVD) or epi-polysilicon layer.

The trench portions 214, 216, and 218 are then filled with a trench oxide portion 220 as shown in FIGS. 5 and 6 using a conformal oxide deposition. Oxide deposition further results in an oxide layer 222 on the upper surface of the device layer 206. The thickness of the oxide layer 222 sets the gap between two electrodes as discussed more fully below. The oxide layer 222 may be planarized by any desired technique such as chemical mechanical polishing (CMP).

Figures 9, 10:
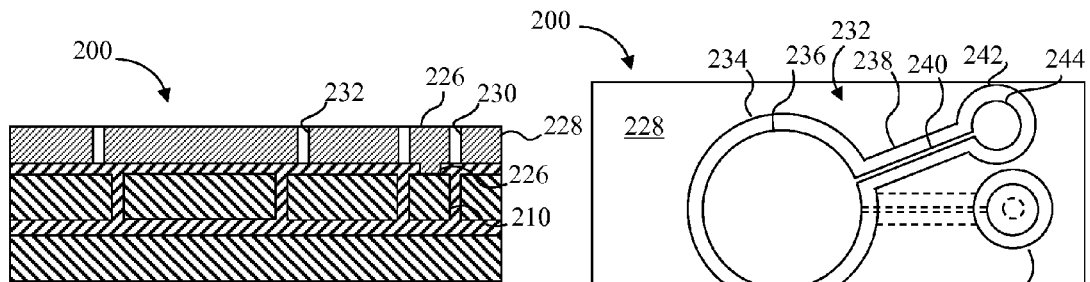
FIG. 9 depicts the wafer of FIG. 7 with a first cap layer portion formed above the oxide layer and trenches formed in the oxide layer.
FIG. 10 depicts a top plan view of the wafer of FIG. 9.

Referring to FIGS. 7 and 8, a contact opening 224 is then etched through the oxide layer 222 to expose the upper surface of the lower contact portion 210. An epi-poly deposition fills the contact opening 224 with a lower middle contact portion 226 of epi-poly while depositing a lower cap layer portion 228 above the oxide layer 222 as shown in FIGS. 9 and 10. The lower middle contact portion 226 thus extends from the upper surface of the lower contact portion 210 to the upper surface of the lower cap layer portion 228. In an alternative embodiment, the lower cap layer portion 228 may be a single crystal silicon formed using a fusion bonding process followed by grinding/polishing or Smart-Cut technology to remove the bulk of the bonded wafer. In this alternative embodiment, electrical contacts must be formed after fusion. In a further embodiment, a polished polysilicon device layer may be used.

FIGS. 9 and 10 further show trenches 230 and 232 which may be etched after CMP of the lower cap layer portion 228. The trench 230 extends from the upper surface of the lower cap layer portion 228 to the upper surface of the oxide layer 222 to define the lower middle contact portion 226. The trench 232 includes a trench portion 234 that defines a lower out-of-plane electrode portion 236, a trench portion 238 that defines a connector 240, and a trench portion 242 that defines a lower contact portion 244 for the lower out-of-plane electrode portion 236.

Figures 11, 12:
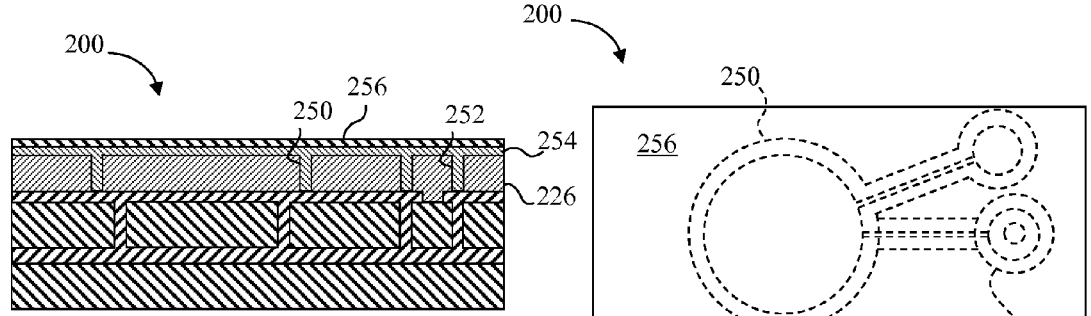
FIG. 11 depicts the wafer of FIG. 9 with the trenches filled with an insulating material, the insulating material also forming a layer above the first cap layer portion, and an etch stop layer formed above the insulating layer.
FIG. 12 depicts a top plan view of the wafer of FIG. 11.
Figures 13, 14:
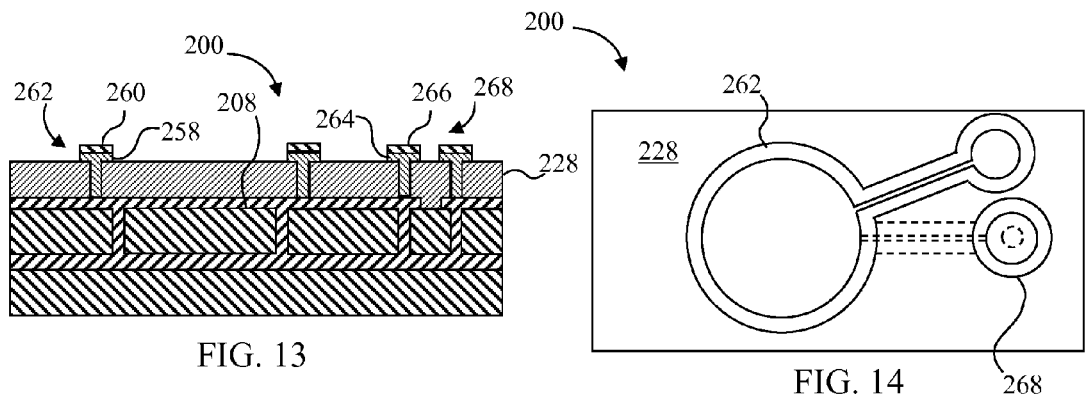
FIG. 13 depicts the wafer of FIG. 11 after the insulating layer and etch stop layer have been etched to define gaskets for an out-of-plane electrode and a device layer contact.
FIG. 14 depicts a top plan view of the wafer of FIG. 13.

A low stress nitride is then used to fill the trenches 230 and 232 with trench nitride portions 250 and 252 while a low stress nitride layer 254 is deposited on the upper surface of the lower cap layer portion 228 as shown in FIGS. 11 and 12. A thin oxide layer 256 is provided on the upper surface of the low stress nitride layer 254. The thin oxide layer 256 and the nitride layer 254 are then patterned and etched resulting in the configuration of FIGS. 13 and 14. In FIGS. 13 and 14, a remainder 258 of the oxide layer 256 and a remainder 260 of the nitride layer 254 form a gasket 262 for an out-of plane electrode described more fully below. A remainder 264 of the oxide layer 256 and a remainder 266 of the nitride layer 254 form a gasket 268 for a contact the in-plane-electrode 208. The lateral extent of the gaskets 262 and 268 when viewed in cross-section may be selected to provide the desired isolation characteristics for the components defined thereby.

Figure 15:
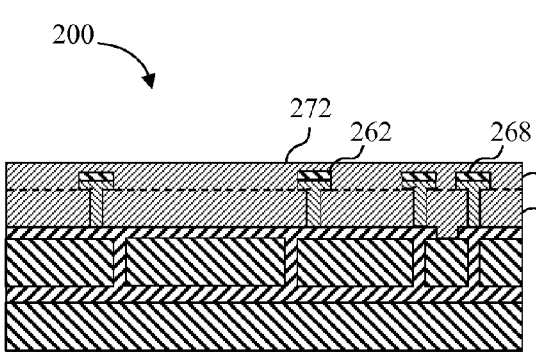
FIG. 15 depicts the wafer of FIG. 13 after a second cap layer portion has been deposited above the first cap layer portion and the gaskets, and the second cap layer portion has been planarized.
Figure 16:
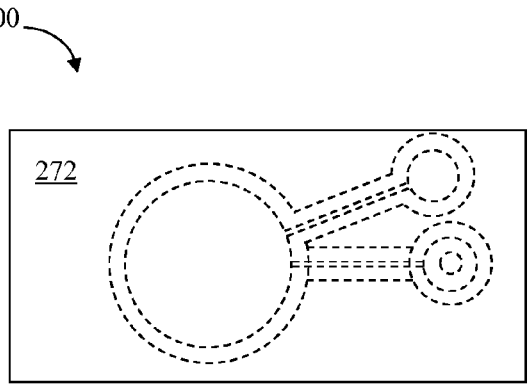
FIG. 16 depicts a top plan view of the wafer of FIG. 15.

A thin epi-poly deposition layer 270 is then formed on the upper surface of the lower cap portion 228 and the upper surface of the gaskets 262 and 268 to form a middle cap layer portion 272 (see FIGS. 15 and 16). The epi-poly deposition layer may be deposited in the manner described by Candler et al., "Long-Term and Accelerated Life Testing of a Novel Single-Wafer Vacuum Encapsulation for MEMS Resonators", *Journal of Microelectricalmechanical Systems*, vol. 15, no. 6, December 2006. The middle cap layer portion 272 may be planarized if desired.

Figure 17:
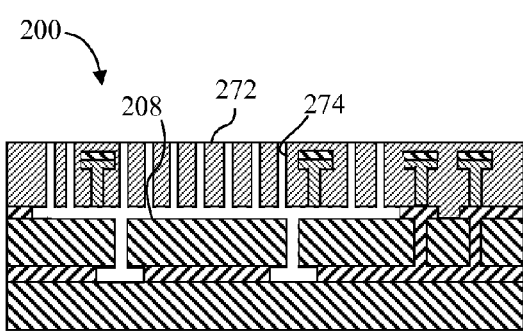
FIG. 17 depicts the wafer of FIG. 15 after vapor etch vent holes have been etched through the first cap layer portion and the second cap layer portion, and a portion of the oxide layer, the oxide material in the device layer, and a portion of a buried oxide layer have been etched, thereby electrically isolating an in-plane electrode and releasing the first cap layer portion above the in-plane electrode.
Figure 18:
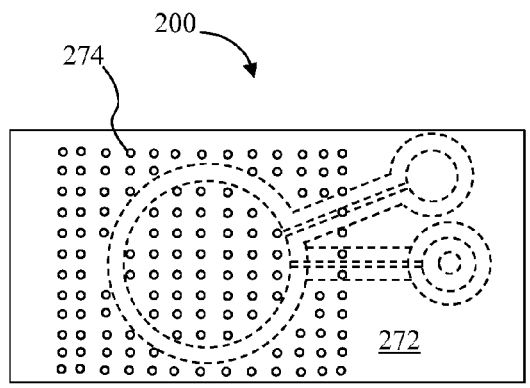
FIG. 18 depicts a top plan view of the wafer of FIG. 17.
Figure 19:
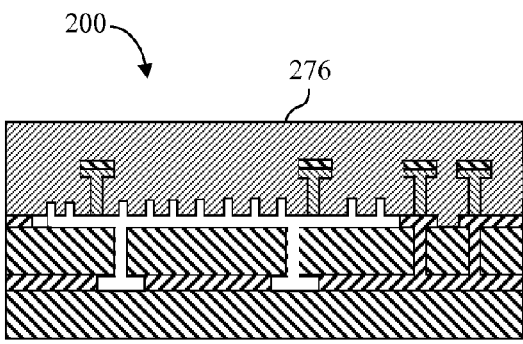
FIG. 19 depicts the wafer of FIG. 17 after the vapor etch vent holes have been sealed by a third cap layer portion.
Figure 20:
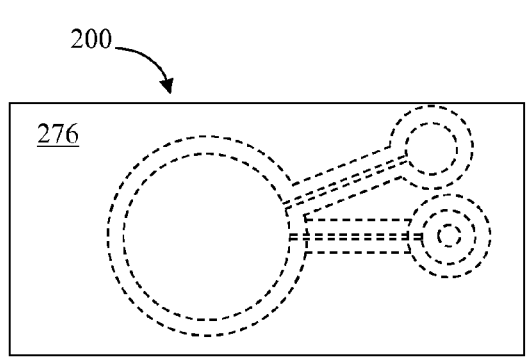
FIG. 20 depicts a top plan view of the wafer of FIG. 19.

Referring to FIGS. 17 and 18, after vent holes 274 are formed, an HF vapor etch release is performed which releases the middle cap layer portion 272 from the in-plane-electrode 208. The etched portion of the oxide layer 222 between the upper surface of the in-plane-electrode 208 and the lower surface of the middle cap layer portion 272 thus sets the gap between the in-plane-electrode 208 and the lower surface of what will be the out-of-plane electrode. A clean high temperature seal is then performed in an epi reactor to seal the vent holes 274. Alternatively, the vent holes 274 may be sealed using oxide, nitride, silicon migration, etc. The resulting configuration is shown in FIGS. 19 and 20 wherein a layer portion 276 is formed above the middle cap layer portion 272.

Figure 21:
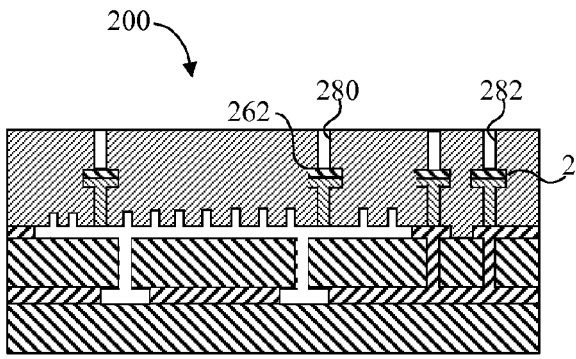
FIG. 21 depicts the wafer of FIG. 19 with trenches formed through the third cap layer portion and the second cap layer portion to upper surfaces of the gaskets.
Figure 22:
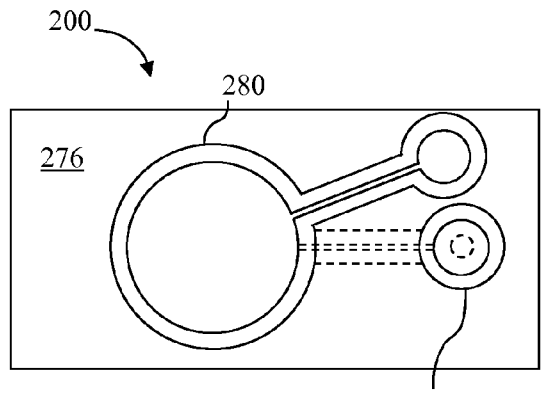
FIG. 22 depicts a top plan view of the wafer of FIG. 21.
Figure 23:
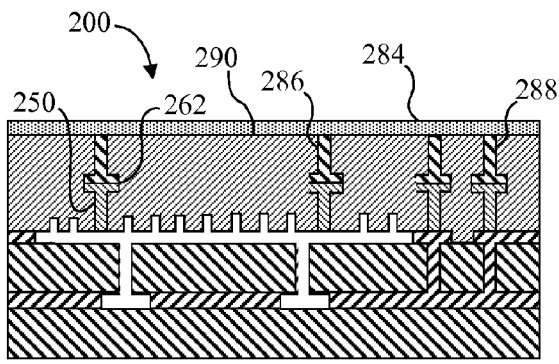
FIG. 23 depicts the wafer of FIG. 21 with an insulating material deposited within the trenches and a silicide forming material deposited along the upper surface of the third cap layer portion.
Figure 24:
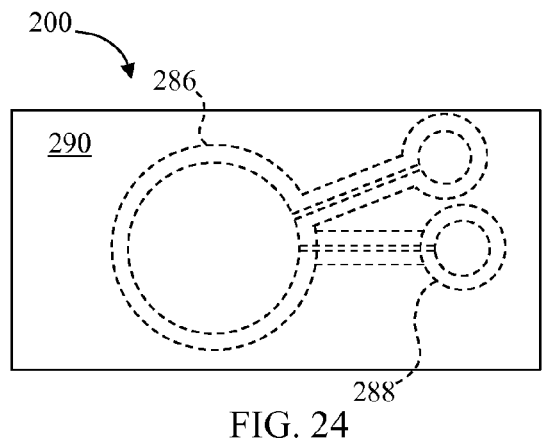
FIG. 24 depicts a top plan view of the wafer of FIG. 23.

A trench 280 and a trench 282 are then etched as depicted in FIGS. 21 and 22. The trench 280 extends from the upper surface of the layer portion 276 to the upper surface of the gasket 262 which acts as an etch stop. The trench 282 extends from the upper surface of the layer portion 276 to the upper surface of the gasket 268 which acts as an etch stop. A passivation material, which may be oxide, nitride, etc., is then deposited in the trenches 280 and 282 to form passivation portions 286 and 288 and patterned and a silicide forming metal 290 is deposited on the upper surface of the layer portion 276 (see FIGS. 23 and 24). The silicide-forming material 290 may be titanium (Ti), tantalum (Ta), nickel (Ni), tungsten (W), or platinum (Pt).

After the silicide-forming material 290 is deposited, the assembly 200 is subjected to an annealing process. In some embodiments, the duration of the annealing process can be in a range of one (1) second to one (1) minute. The temperature of the annealing process in these embodiments can be in a range of 250° C. to 800° C., depending on the type of silicide-forming metal 190 used in the process. In some embodiments, the annealing temperature is less than 450° C. It should be understood that the annealing temperature of less than 450° C. in these embodiments is not limiting because only a short anneal time is required for silicide formation.

Figure 25:
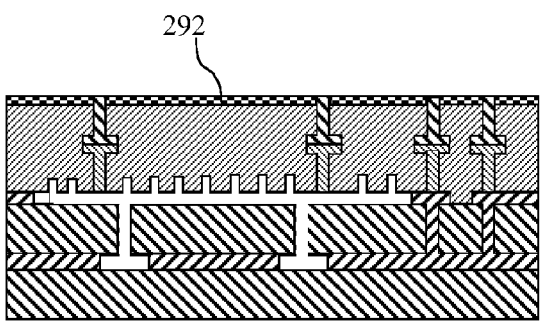
FIG. 25 depicts a side cross-sectional view of a wafer including a silicide layer formed in an upper portion of the cap layer.

In the annealing process, silicide forming material which is directly above a silicon material reacts with the silicon material to form silicide 292 as shown in FIG. 25. Silicide forming material which is above non-silicon material, such as the passivation portions 286 and 288 does not react. A metal-etch process is used to remove the residual metal that is not converted into silicide.

In some embodiments, silicide is formed only in a top portion of a cap layer. An example of such an embodiment is a piezo-resistive pressure sensor that has the silicide formed on the top portion of the cap layer to provide a connection to one or more piezo-resistors. In other embodiments, the silicide is formed throughout the entire depth of the cap layer.

This selective silicide forming process can be done using a patterned passivation layer on top of which the silicide forming metal is deposited. After anneal and silicide formation, the excess unreacted metal is removed using a metal etch. Another option is to pattern the silicide forming metal prior to the annealing process.

The process described can further be used in order to realize conductive structures with low resistance on and closely besides the pressure sensor membrane without impacting the mechanical properties.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

The invention claimed is:

1. A method of forming a sensor device, comprising:
   defining an in-plane electrode in a device layer of a silicon on insulator (SOI) wafer;
   forming an out-of-plane electrode in a silicon cap layer located above an upper surface of the device layer by forming at least one non-silicon spacer in the cap layer;
   depositing a silicide-forming metal on a top surface of the silicon cap layer and on a top surface of the at least one non-silicon spacer; and
   annealing the deposited silicide-forming metal to form a silicide portion in the silicon cap layer.

2. The method of claim 1, wherein annealing the deposited silicide-forming metal comprises rapid thermal annealing the deposited silicide-forming metal.

3. The method of claim 1, further comprising:
   etching a residual silicide-forming metal from the top surface of the silicon cap layer.

4. The method of claim 1, wherein depositing the silicide-forming metal comprises:
   depositing a silicide-forming metal selected from a group consisting of nickel, tantalum, titanium, tungsten, and platinum.

5. The method of claim 1, wherein annealing the deposited silicide-forming metal comprises:
annealing the deposited silicide-forming metal for a duration between 1 second and 10 minutes.

6. The method of claim 1, wherein annealing the deposited silicide-forming metal comprises:
annealing the deposited silicide-forming metal at a temperature in a range of 250° C. to 800° C.

7. The method of claim 6, wherein the annealing temperature is less than 450° C.

8. The method of claim 1, wherein annealing the deposited silicide-forming metal comprises:
annealing the deposited silicide-forming metal such that the entire cap layer is converted to silicide.

9. The method of claim 1, further comprising:
removing a portion of the silicide-forming metal deposited on the top surface of the at least one non-silicon spacer in the cap layer after annealing the silicide-forming metal.

10. The method of claim 1, further comprising:
supporting the cap layer with the device layer at a location above the defined in-plane electrode prior to forming the out-of-plane electrode.

11. The method of claim 10, further comprising:
forming a device layer connector portion within the device layer in electrical communication with the defined in-plane electrode; and
forming a cap layer connector portion within the supported cap layer, the cap layer connector portion in electrical communication with the device layer connector portion.

12. The method of claim 1, further comprising:
placing the formed silicide portion in the silicon cap layer in electrical communication with a piezo-resistor.

13. A sensor device, comprising:
an in-plane electrode;
a cap layer spaced apart from an upper surface of the in-plane electrode;
an out-of-plane electrode defined in the cap layer by at least one first non-silicon spacer;
a connector portion defined in the cap layer and in electrical communication with the in-plane electrode, the connector portion having a silicide upper surface; and
a silicide portion formed in the cap layer.

14. The sensor device of claim 13, wherein the silicide portion and the silicide upper surface are formed in the cap layer by annealing a silicide-forming metal deposited on a top surface of the cap layer.

15. The sensor device of claim 14, wherein the silicide-forming metal is one or more of nickel, tantalum, titanium, tungsten, and platinum.

16. The sensor device of claim 13, wherein the sensor device is a pressure sensor device and the silicide portion is formed throughout an entire depth of the cap layer.

17. The sensor device of claim 13, further comprising:
at least one piezo-resistor, wherein the silicide portion is formed in a top portion of the cap layer in electrical communication with the at least one piezo-resistor so as to provide an electrical connection to the at least one piezo-resistor.

18. The sensor device of claim 13, further comprising:
a second non-silicon spacer extending downwardly from an upper surface of the cap layer, the second non-silicon spacer electrically isolating the silicide portion from the silicide upper surface.

* * * * *